(12) United States Patent
Lee et al.

(10) Patent No.: US 7,808,046 B2
(45) Date of Patent: Oct. 5, 2010

(54) ELECTROSTATIC PROTECTION DEVICE FOR SEMICONDUCTOR CIRCUIT

(75) Inventors: Yoon Sung Lee, Kyoungki-do (KR);
Kook Whee Kwak, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 246 days.

(21) Appl. No.: 11/448,299

(22) Filed: Jun. 7, 2006

(65) Prior Publication Data

US 2006/0278931 A1    Dec. 14, 2006

(30) Foreign Application Priority Data

Jun. 11, 2005 (KR) .................... 10-2005-0050098

(51) Int. Cl.
*H01L 23/62* (2006.01)
(52) U.S. Cl. .............. 257/355; 257/365; 257/E27.004; 438/157
(58) Field of Classification Search ............. 257/365, 257/362, 355, E27.004, E29.255, E23.011, 257/E29.12; 438/157
See application file for complete search history.

(56) References Cited

U.S. PATENT DOCUMENTS

2002/0020845 A1* 2/2002 Ogura et al. ............... 257/88

FOREIGN PATENT DOCUMENTS

KR      1997-0055319 A      7/1997
KR      1998-0042939 A      8/1998

* cited by examiner

*Primary Examiner*—Kiesha R Bryant
*Assistant Examiner*—Tucker Wright
(74) *Attorney, Agent, or Firm*—Ladas & Parry LLP

(57) ABSTRACT

The electrostatic protection device includes a semiconductor substrate having a well formed therein. At least two sets of transistor fingers, for example the NMOS type, are spaced apart from each other. Each set of the MOS fingers includes multiple gates arranged in parallel to each other in one direction, and sources and drains alternately arranged at both sides of the gates in the semiconductor substrate. A well pickup surrounding every set of the transistor fingers and extending between any two set of the fingers is formed. Metal wires are connected to at least two portions of each of the drains and are also connected to an input/output pad to which Electrostatic Discharge (ESD) excessive current is introduced.

14 Claims, 4 Drawing Sheets

ELECTROSTATIC PROTECTION DEVICE FOR SEMICONDUCTOR CIRCUIT

BACKGROUND OF THE INVENTION

1. Field of the Invention

The present invention relates generally to an electrostatic protection device for a semiconductor circuit, and more particularly to a connection structure of an electrostatic protection device for preventing damage due to discharge of electrostatic charges.

2. Description of the Prior Art

A semiconductor integrated circuit (IC) could be damaged when it comes in contact with a charged human body or machine. An unhealthy dose of static electricity or electrostatic discharge (ESD) charges from a human body or a machine could be discharged into the semiconductor IC through its contacting external pin(s) and pad(s), such that an excessive current of large energy introduced into the semiconductor IC may cause the internal damage.

Therefore, an ESD protection device is typically formed in a semiconductor IC between a pad and its internal circuit in order to protect the important circuits from such electrostatic damage. An ESD protection device having a large area is preferred, since it will allow a larger-capacity current to pass to the ground preventing major damage to the internal circuitry. FIG. 1 shows an example of such an ESD protection device having a large area, which has a multi-finger structure of multiple transistors having common drains.

FIG. 1 shows the design of a conventional ESD protection device connected to a pad 1 of an IC. The ESD protection device as shown in FIG. 1 has the multi-finger structure and includes a plurality of NMOS "finger" transistors, where each "finger" transistor has a gate 2 such that a source 3 a common drain 4 are alternately arranged adjacent each gate 2 of each "finger" transistor. (Note that not every gate, source, and drain are labeled with 2, 3, 4 in FIG. 1, but they should be readily apparent from FIG. 1.) When ESD charges are generated, the ESD charges would flow in the direction labeled with arrows 10 through the metal wires M1~M7 connected to the pad 1 and through the common drains 4 of the transistors in order to be discharged through the sources 3 into the well pickup 5, thereby preventing damage to the internal circuits of the semiconductor IC.

However, in the above-mentioned conventional structure for an ESD protection device, the pad 1 is connected to only one end of the common drain 4. Therefore, when excessive current flowing due to ESD charges is concentrated at the end of each common drain 4 connected to the pad 1, the metal wires M1~M7 at the connected end may melt or the connected end of each drain 4 itself may be damaged by the ESD.

Further, the conventional structure as shown in FIG. 1 could be problematic when the excessive current passes through the pickup 5 surrounding the multi-fingered transistor structure. More specifically, the common drain connected to the fourth metal wire M4 located at the center of multi-fingered ESD protection device as shown in FIG. 1 is located the farthest away from the well pickup 5 in the X-axis direction; thus, a larger well resistance is present between the common drain connected to M4 and the well pickup 5 than between any of the other common drains and the well pickup 5. As a result, the entire NMOS "finger" transistors of the conventional ESD protection device may yield non-uniform results at the time of bipolar turn-on.

SUMMARY OF THE INVENTION

Accordingly, the present invention has been made to solve the above-mentioned and other problems occurring in the prior art, and an object of the present invention is to provide an ESD protection device for a semiconductor circuit, which can prevent metal wires from being molten by the current concentration and drains from being attacked by the ESD.

It is another object of the present invention to provide an ESD protection device for a semiconductor circuit, which can achieve a uniform ESD through the entire ESD protection device.

In order to accomplish this and others, there is provided an electrostatic protection device for a semiconductor circuit, the electrostatic protection device including: a semiconductor substrate having a well formed therein; at least two MOS fingers spaced apart from each other, each of the MOS fingers including multiple gates arranged in parallel to each other in one direction, and sources and drains alternately arranged at both sides of the gates in the semiconductor substrate; a well pickup surrounding all of the MOS fingers and extending between the MOS fingers; and metal wires connected to at least two portions of each of the drains and connected to an input/output pad to which Electrostatic Discharge (ESD) excessive current is applied.

The gates in each of the MOS fingers are arranged in parallel to each other in an X direction. The electrostatic protection device includes at least two MOS fingers (for example, two MOS fingers) spaced apart from each other in the X direction.

The gates in each of the MOS fingers are arranged in parallel to each other in a Y direction. The electrostatic protection device includes at least two MOS fingers (for example, two MOS fingers) spaced apart from each other in the X direction.

The well pickup is connected to either one end or both ends of each of the sources.

The metal wires are connected to either both ends of each of the drains, or a central portion and one end of each of the drains, or a central portion and both ends of each of the drains.

Further, the electrostatic protection device further includes metal wires, which are connected to the gates, the well pickup, and the sources, respectively.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, several preferred embodiments of the present invention will be described with reference to the accompanying drawings.

Figure 2:
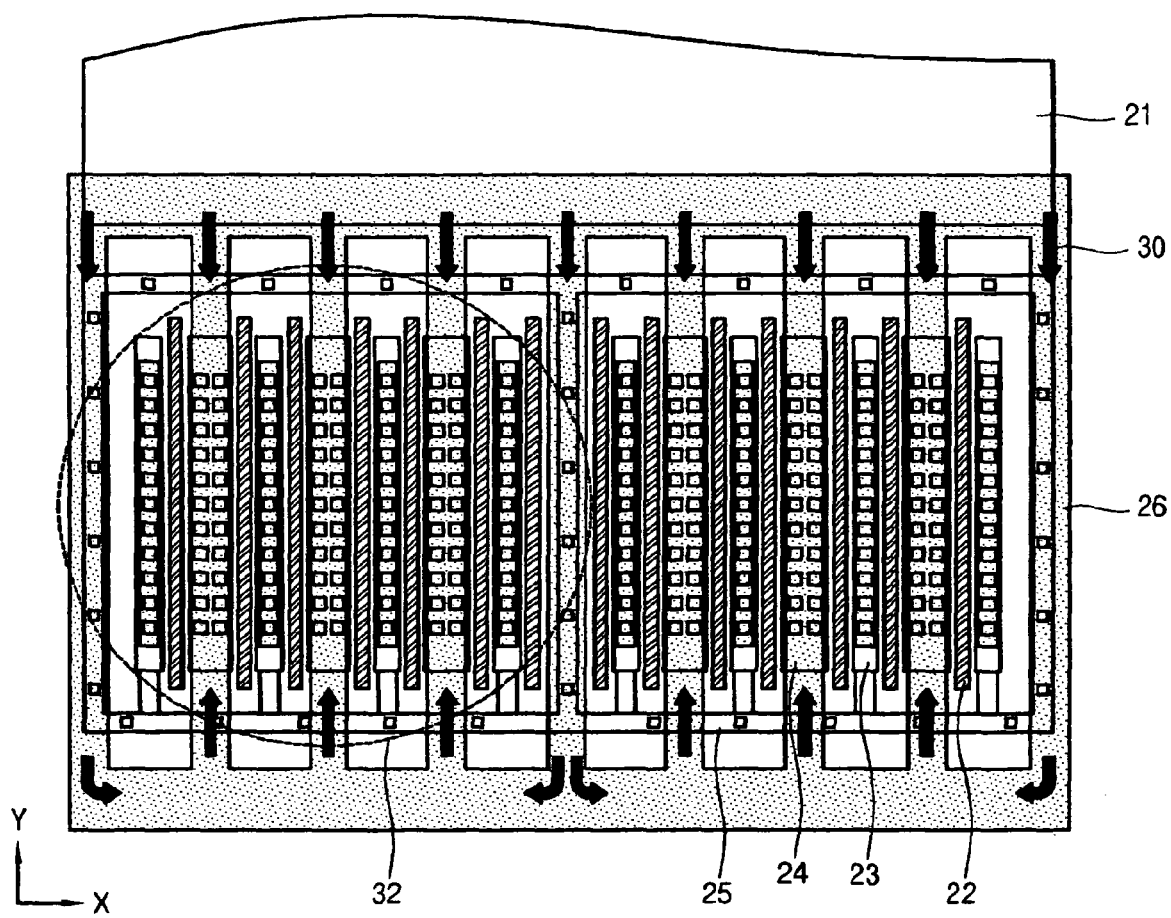
FIG. 2 is a plan view of an ESD protection device for a semiconductor circuit according to an embodiment of the present invention.

FIG. 2 shows the multi-fingered transistor layout of an ESD protection device for a semiconductor circuit according to an embodiment of the present invention.

Figure 1:
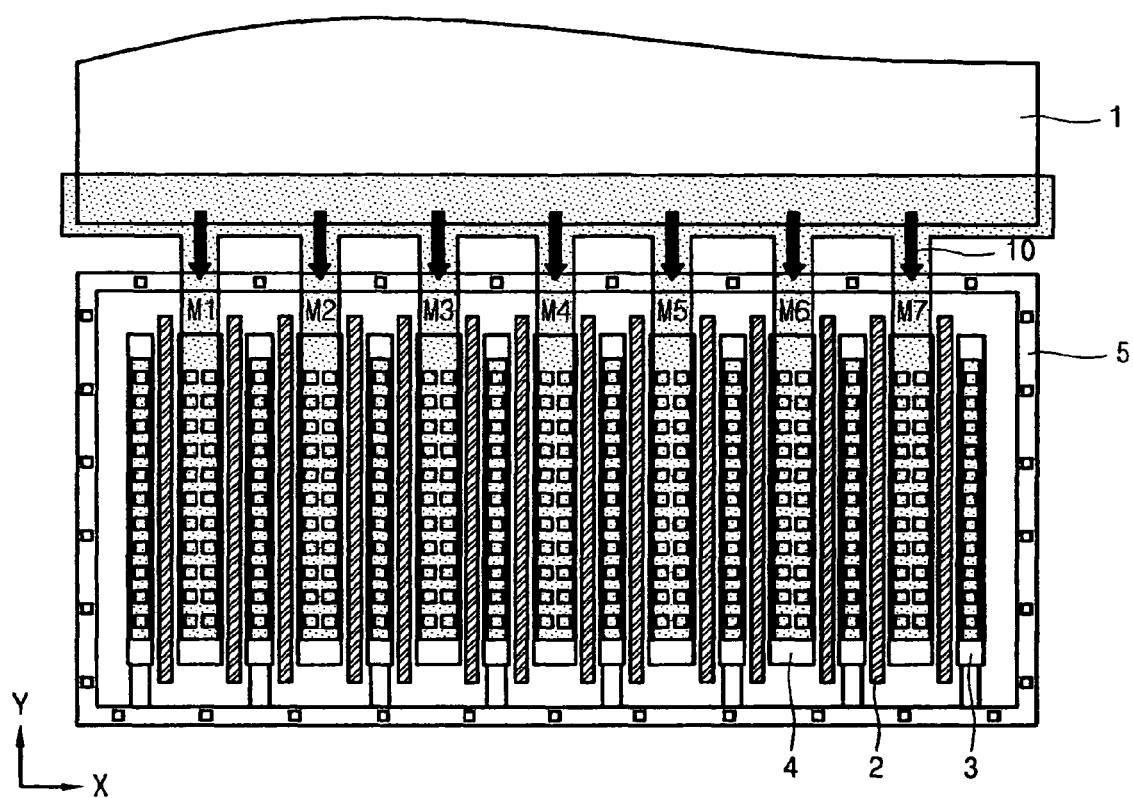
FIG. 1 shows the multiple "finger" transistor design in a conventional ESD protection device for a semiconductor circuit.

As shown, an ESD protection device for a semiconductor circuit according to an embodiment of the present invention includes at least two sets of transistor fingers 32 spaced apart, for example, in the X direction, and a well pickup 25 extending around the entire each set of transistor fingers 32. In this embodiment, the finger transistor is an NMOS transistor although it should be apparent that use of other comparable transistors is also within the scope of the present invention. Each NMOS finger transistor in the set of transistors 32 has a gate 22, a source 23, and a drain 24, which is also connected to the gate of the adjacent transistor. The finger transistors in each set 32 are disposed to run parallel in one direction (e.g., in the y-direction as shown in FIG. 2). Both ends of each drain 24 of every NMOS finger transistor in each set 32 are connected to the metal wires 26, so that they are electrically connected to the pad 21. The flow paths of ESD charges shown with arrows 30 indicate that the charges flow into both ends of each common drain 24. Also, either one end or both ends of each source 23 can be connected to the well pickup 25 (in contrast, only one end of each source 23 is connected to the well pick up 25 in FIG. 1) by way of, for example, a bar-shaped metal wire 26 formed to connect both ends of the drain 24.

In the ESD protection circuit for a semiconductor IC according to an embodiment of the present invention as described above, both ends of each drain 24 are connected to the metal wires 26 and are connected through the metal wires 26 to the pad 21 from which excessive ESD current introduced to the connected drain 24. Therefore, in the ESD protection circuit for a semiconductor IC according to an embodiment of the present invention, the excessive ESD current is distributed to both ends of the drain 24, and this prevents the metal wires 26 from melting or the drain 24 from being damaged.

Further, in the ESD protection circuit for a semiconductor IC according to an embodiment of the present invention, an additional piece of the well pickup 25 is formed between the two sets of the NMOS finger transistors 32 (see FIG. 2, in the middle). As a result, the distance between an NMOS finger transistor in each set 32 and the well pickup 25 (of the ESD circuit of the present embodiment) is shorter than that in the conventional ESD protection device, which does not utilize such a metal wire placed in between two sets of finger transistors. The distance between an NMOS finger transistor in each set 32 and the well pick up 25 also becomes relatively constant. Therefore, the well resistance between a drain 24 in each set 32 and the well pickup 25 as shown in FIG. 2 is reduced, and the well resistance for each finger transistor becomes constant, so that it is possible to expect a uniform bipolar turn-on effect.

Figure 3:
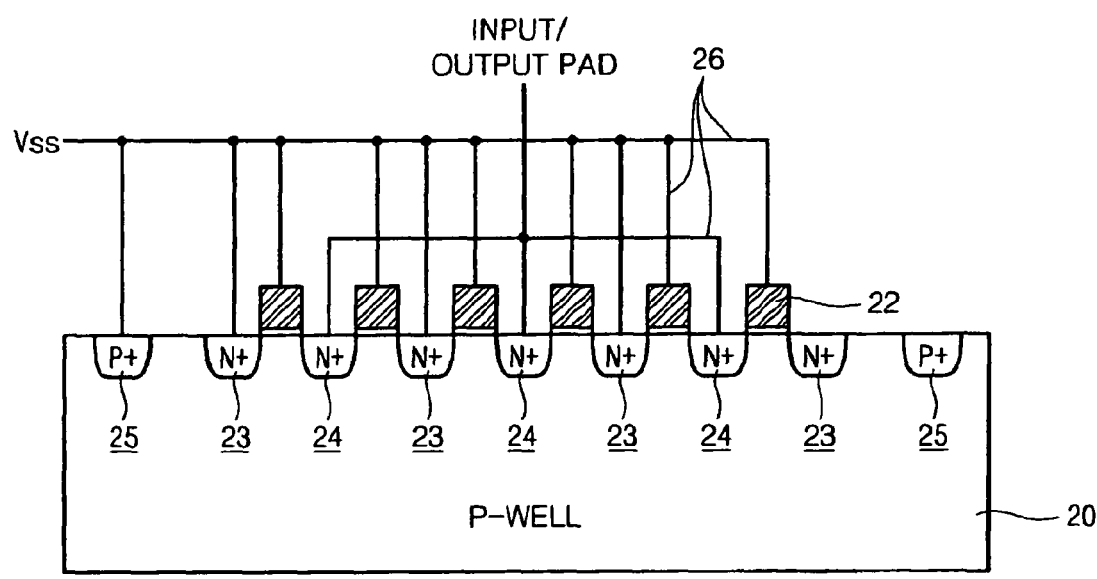
FIG. 3 is a cross-sectional view of the ESD protection device for a semiconductor circuit, which also shows schematically the wire connections, according to an embodiment of the present invention.

FIG. 3 is a cross-sectional view of the ESD protection device shown in FIG. 2, which also shows schematically the electrical connections. Hereinafter, a process for manufacturing an ESD protection device for a semiconductor circuit according to an embodiment of the present invention will be described with reference to FIG. 3.

First, a P-well is formed through ion implantation in a P-type semiconductor substrate 20. Then, a plurality of gates 22 (which have elongated lengths so as to form the "multi-fingered transistor" structure as shown in FIG. 2) are formed in parallel to each other on the semiconductor substrate 20 in which the P-well is formed.

Then, the resultant substrate is subjected to high-density ion implantation of N-type impurities, thereby alternately forming an N+ source 23 and an N+ drain 24 formed below the surface of the substrate at both sides of each gate 22.

Thereafter, P+ ion implantation is performed to form a well pickup 25 in the substrate 20 surrounding the "multi-finger transistor" structure (as shown in FIG. 2), in order to interconnect the well region and the pad 21. Although not shown in detail, the well pickup 25 not only has a portion surrounding the entire ESD protection device but also has a portion disposed between the gates 22 opposed to each other in the X direction, that is, between the NMOS fingers such that one or both end(s) of each source 23 is/are connected to the well pickup 25.

Then, metal wires 26 are formed to connect the gates 22 to the main power, that is, to apply the ground potential Vss in the NMOS. Further, the sources 23 are also connected to the Vss through the metal wires 26. Also, the metal wires 26 are formed to connect at the well pickup 25. Moreover, both ends of each drain 24 are connected to the pad 21 through the metal wires 26.

Although the same reference numeral 26 is used in FIG. 3 to designate the metal wires for interconnecting the gates 22 and the well pickup, the metal wires for interconnecting the drains 24 and the pad 21, and the metal wires for interconnecting the sources and the Vss, the above-mentioned metal wires (all labeled as 26 in FIG. 3) are connected differently for the intended purpose in view of the time and layers for the formation of the metal wires. FIG. 3 schematically shows the electrical interconnections of the metal wires 26; therefore, it is apparent to those skilled in the related art that there is no unintended electric short-circuiting between the metal wires.

Figure 4:
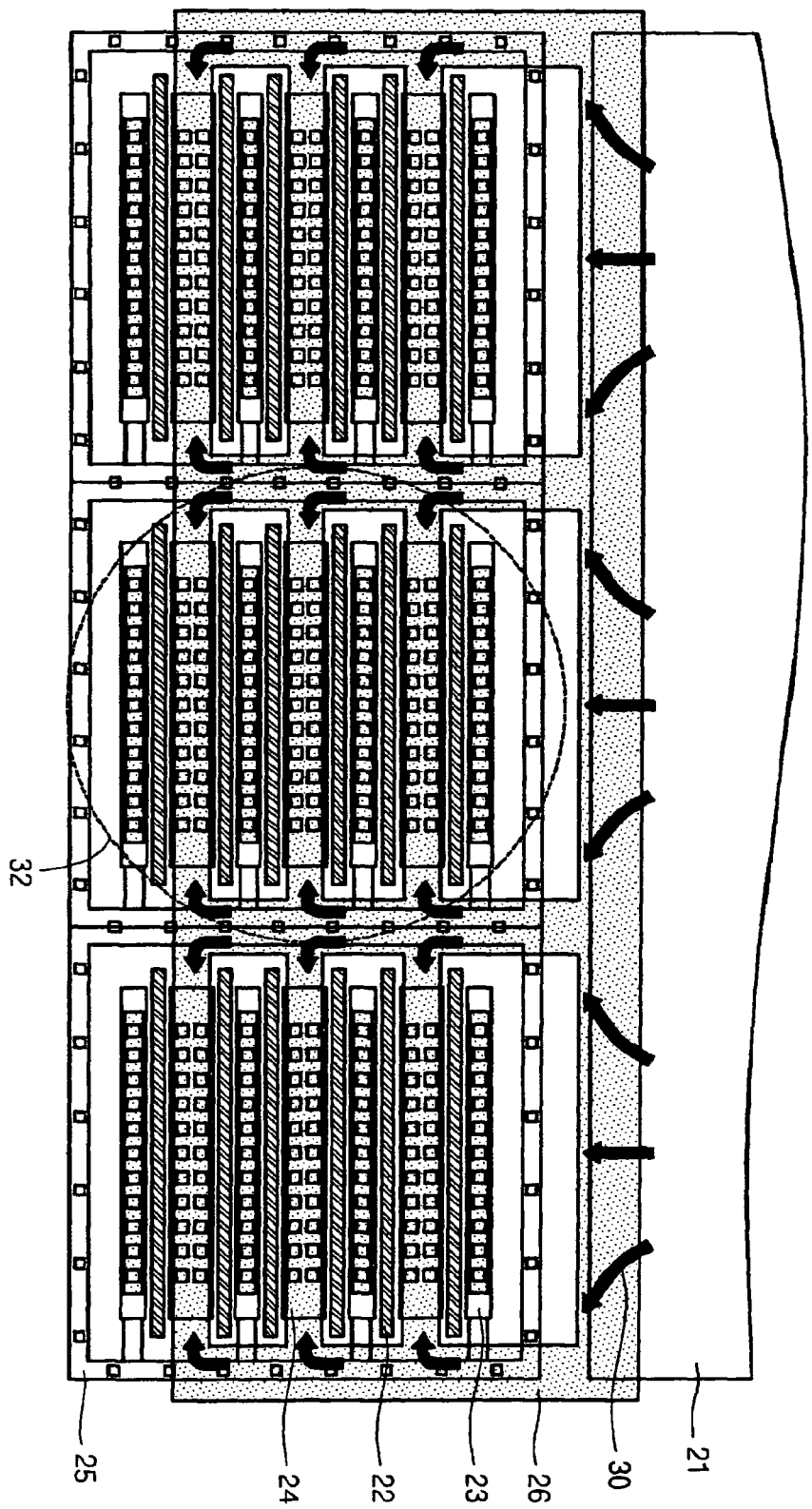
FIG. 4 is a plan view of an ESD protection device for a semiconductor circuit according to another embodiment of the present invention.

FIG. 4 is a plan view of an ESD protection device for a semiconductor circuit according to another embodiment of the present invention. The names of the elements labeled with references numerals in FIG. 4 are same as those elements having the same reference numerals in FIG. 2.

In this embodiment of the present embodiment, (1) the arrangement or layout of the gates 22, the sources 23, and the drains 24 is modified, and (2) the arrangement of the multiple set of the NMOS finger transistors 32 is modified. Specifically, according to the present embodiment of the present embodiment, the gates 22 are arranged in parallel in the Y direction; the sources 23 and the drains 24 are alternately disposed at both sides of the gates 22; and at least two sets of NMOS fingers 32 are spaced apart in the X direction.

The ESD protection device according to this embodiment of the present embodiment also can prevent local concentration of excessive current on a portion of the drain 24, thereby preventing the metal wires 26 from being molten and the drains 24 from being damaged.

Figure 5:
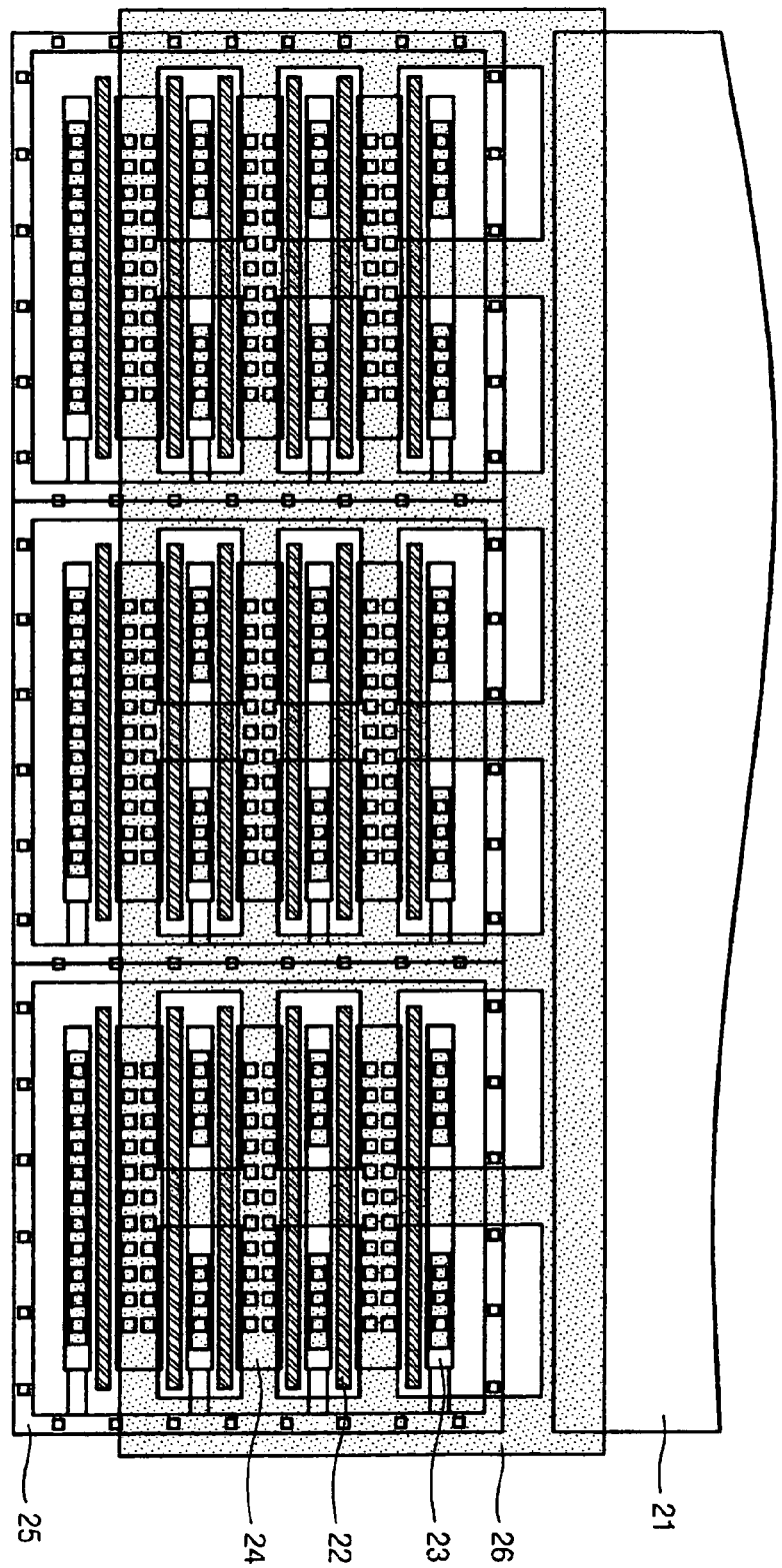
FIG. 5 is a plan view of an ESD protection device for a semiconductor circuit according to still another embodiment of the present invention.

FIG. 5 is a plan view of an ESD protection device for a semiconductor circuit according to yet another embodiment of the present invention.

While the metal wires 26 are connected to both ends of each drain 24 in the ESD protection device in the similar manner as shown in FIG. 4, the metal wires 26 are also connected to a central portion of each drain 24 in addition to both ends of each drain 24 in the ESD protection device according to this embodiment of the present embodiment.

The element names of the reference numerals in FIG. 5 is same as those with the same reference numerals in FIG. 4.

This construction can prevent the local concentration of the excessive current. However, in order to connect the central portion of each drain 24 with the pad by the metal wire 26, it is necessary to eliminate the central portion of the metal wire on each source 23 and thus it inevitably loses as much contact area between the metal wire 26 and the source 23 as the eliminated portion in connection with the main power Vss. Therefore, in this regard, the construction shown in FIG. 5 may not be viewed as more efficient than the construction shown in FIG. 4.

While, the present invention can apply to the PMOS type as well as the NMOS type.

According to various embodiments of the present invention as described above, both ends of each drain 24 are connected to the pad 21 through the metal wires 26, so that it is possible to prevent local concentration of excessive current due to ESD, thereby preventing the metal wires from melting and the drains from being damaged.

Further, according to various embodiments of the present invention, the well pickup 25 has an additional portion located between the two sets of the NMOS fingers 32, which can reduce the well resistance between the drains 24 and the well pickup 25 and can make the well resistance for each set of the NMOS fingers 32 to remain constant, so that it is possible to expect uniform bipolar turn-on effect.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. An electrostatic protection device for a semiconductor circuit comprising:
    a semiconductor substrate having a well formed therein;
    at least two sets of transistor fingers formed in at least two predetermined areas spaced apart from each other of the semiconductor substrate, each transistor finger among a set of transistor fingers extending in a first direction along the substrate and having a first end and a second end opposite the first end, each set of the transistor fingers comprising:
    a plurality of gates arranged in parallel with respect to each other in one direction; and
    a plurality of sources and drains, wherein one source and one drain are alternately arranged at each side of each gate in the semiconductor substrate;
    a well pickup surrounding each set of the transistor fingers such that any two sets of the transistor fingers are separated by a portion of the well pickup; and
    metal wires disposed in a second direction separated from each other by a distance along the first direction, the metal wires connected to at least two portions of each of the drains and connected to an input/output pad to which electrostatic discharge (ESD) excessive current is introduced, wherein the ESD excessive current is introduced to each of the drains through the metal wires.

2. The electrostatic protection device of claim 1, wherein the gates, the sources, and the drains in each set of the transistor fingers are arranged in the first direction substantially perpendicular to the direction of the side of the pad to which the metal wires are connected.

3. The electrostatic protection device of claim 2, wherein the well pickup is connected to at least one of a first end and a second end of of each of the sources corresponding to the first and second ends of the transistor fingers.

4. The electrostatic protection device of claim 3, wherein the metal wires are connected to first and second ends of each of the drains corresponding to the first and second ends of the transistor fingers.

5. The electrostatic protection device of claim 3, wherein each transistor finger is of an NMOS type.

6. The electrostatic protection device of claim 1, wherein the gates, the sources, and the drains in each set of the transistor fingers are arranged in the direction substantially parallel to the direction of the side of the pad to which the metal wires are connected.

7. The electrostatic protection device of claim 6, wherein the well pickup is connected to either one or both ends of each of the sources.

8. The electrostatic protection device of claim 7, wherein the metal wires are connected to both ends of each of the drains.

9. The electrostatic protection device of claim 8, wherein each transistor finger is of an NMOS type.

10. The electrostatic protection device of claim 1, wherein the well pickup is connected to at least one of a first and a second end of each of the sources corresponding to the first and second ends of the transistor fingers.

11. The electrostatic protection device of claim 1, wherein the metal wires are connected to both first and second ends of each of the drains corresponding to the first and second ends of the transistor fingers.

12. The electrostatic protection device of claim 1, wherein the metal wires are connected to a central portion and at least one of a first and second end of each of the drains corresponding to the first and second ends of the transistor fingers.

13. The electrostatic protection device of claim 1, wherein the metal wires are connected to a central portion and both a first end and a second end each of the drains corresponding to the first and second ends of the transistor fingers.

14. The electrostatic protection device of claim 1, wherein each transistor finger is of an NMOS type.

* * * * *